United States Patent
Kim et al.

(10) Patent No.: US 7,737,429 B2
(45) Date of Patent: Jun. 15, 2010

(54) NITRIDE BASED SEMICONDUCTOR DEVICE USING NANORODS AND PROCESS FOR PREPARING THE SAME

(75) Inventors: Min Ho Kim, Kyungki-do (KR); Masayoshi Koike, Kyungki-do (KR); Kyeong Ik Min, Seoul (KR); Seong Suk Lee, Chunlabook-do (KR); Sung Hwan Jang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 787 days.

(21) Appl. No.: 11/204,226

(22) Filed: Aug. 16, 2005

(65) Prior Publication Data

US 2006/0091408 A1 May 4, 2006

(30) Foreign Application Priority Data

Oct. 29, 2004 (KR) ...................... 10-2004-0087202

(51) Int. Cl.
*H01L 29/06* (2006.01)
(52) U.S. Cl. ............................. 257/11; 257/12; 257/13; 257/94; 257/E29.069; 257/E29.07; 257/E29.071; 257/E29.245
(58) Field of Classification Search ................... 257/11, 257/12, 13, 94, E29.069–E29.071, E29.245
See application file for complete search history.

(56) References Cited

U.S. PATENT DOCUMENTS 6,649,287 B2    11/2003    Weeks, Jr. et al.
6,692,568 B2 *  2/2004    Cuomo et al. ................. 117/84
2005/0067935 A1 * 3/2005   Lee et al. ..................... 313/309
2005/0179052 A1 * 8/2005   Yi et al. ....................... 257/183

FOREIGN PATENT DOCUMENTS

| JP | 11-186178 A | 7/1999 |
| JP | 2002-164521 | 6/2002 |
| JP | 2003-22973 | 1/2003 |
| JP | 2003-243316 | 8/2003 |
| JP | 2004-515074 A | 5/2004 |
| JP | 2004-289095 A | 10/2004 |
| JP | 2006-511075 A | 3/2006 |
| WO | WO 02/45140 A2 | 6/2002 |
| WO | WO 2004/057663 A1 | 7/2004 |

OTHER PUBLICATIONS

United States Office Action issued in U.S. Appl. No. 12/497,060 dated Dec. 29, 2009.

* cited by examiner

*Primary Examiner*—Lynne A Gurley
*Assistant Examiner*—Samuel A Gebremariam
(74) *Attorney, Agent, or Firm*—McDermott Will & Emery LLP

(57) ABSTRACT

Disclosed are a nitride based semiconductor device, including a high-quality GaN layer formed on a silicon substrate, and a process for preparing the same. A nitride based semiconductor device in accordance with the present invention comprises a plurality of nanorods aligned and formed on the silicone substrate in the vertical direction; an amorphous matrix layer filling spaces between nanorods so as to protrude some upper portion of the nanorods; and a GaN layer formed on the matrix layer.

7 Claims, 5 Drawing Sheets (a)

(b)

(a)

(b)

(a)

(b)

NITRIDE BASED SEMICONDUCTOR DEVICE USING NANORODS AND PROCESS FOR PREPARING THE SAME

RELATED APPLICATION

The present application is based on, and claims priority from, Korean Application Number 2004-87202, filed Oct. 29, 2004, the disclosure of which is incorporated by reference herein in its entirety.

BACKGROUND OF THE INVENTION

1. Field of the Invention

The present invention relates to a nitride based semiconductor device and a process for preparing the same, and more particularly to a nitride based semiconductor device which has nanorods and an amorphous matrix layer on a substrate and thus is capable of inhibiting occurrence of cracks and a process for preparing the same 2. Description of the Related Art Generally, light emitting diodes (LEDs) are broadly divided into blue and green visible light, and UV light LEDs, using a nitride based semiconductor, and green and red LEDs using semiconductor materials such as GaAs or GaP. Recently, owing to development of a blue light LED using the nitride based semiconductor such as gallium nitride, the primary colors of light are realized by the LED and thereby realization of a full color display has become feasible. Further, improved luminance of LEDs is rapidly expanding the number of fields in which LEDs may be utilized, including use thereof as a lighting source, catalyzing world-wide efforts to develop new applications for LEDs.

Up to now, in order to realize a great part of nitride based semiconductor devices including nitride based LEDs, a single crystal sapphire ($Al_2O_3$) substrate or silicon carbide (SiC) substrate is used. However, such substrates are expensive and the size of the substrate is limited to a range of about 2 to 3 inches, resulting in difficulty of large diameter substrate production and thus being unsuitable for mass production.

Members of industries and academic areas relating to semiconductors have already acknowledged that in order to implement true mass production of nitride based semiconductors, use of the silicon (Si) substrate is most preferred, and research into methods for implementation of the nitride based semiconductor devices using the silicon substrate are underway. However, large lattice constant and thermal expansion coefficient differences are present between the Si substrate and group III nitride semiconductor such as GaN. For such reasons, a GaN layer formed on the Si substrate undergoes significant cracking. Such cracks formed on the GaN layer lead to significant deterioration of performance of devices manufactured using the GaN layer and have fatal effects on the service life of such devices. In order to overcome these problems, a great deal of research and study is underway throughout the world.

One method of solving the above-mentioned problems is to grow the GaN layer on a buffer layer of $Al_xGa_{1-x}N$ after formation of the buffer layer on the Si substrate. U.S. Pat. No. 6,649,287 discloses a method of forming a transition layer of $Al_xGa_{1-x}N$ with an Al composition varying in the direction of the thickness thereof on the silicon substrate, in order to alleviate lattice constant and thermal expansion coefficient differences between the Si substrate and GaN layer.

FIG. 1 is a cross-sectional view of a conventional nitride based semiconductor device including a GaN layer formed on a Si substrate. Referring to FIG. 1, an $Al_xGa_{1-x}N$ buffer layer 13 is formed on a Si substrate 11 and an n-type GaN layer 15 is formed on the buffer layer 13. The $Al_xGa_{1-x}N$ buffer layer 13 serves to reduce stress or cracks occurring when forming the GaN. layer on the silicon substrate. Meanwhile, the $Al_xGa_{1-x}N$ buffer layer 13 has a different Al composition along the direction of thickness, in order to alleviate differences of lattice constant and thermal expansion coefficient between Si and GaN. That is, stress due to differences of crystal structure between Si and GaN is alleviated by controlling the Al composition of the $Al_xGa_{1-x}N$ buffer layer 13 to be higher on the Si substrate 11 side than on the GaN layer 15 side. Therefore, the GaN layer 15 grown on the $Al_xGa_{1-x}N$ buffer layer 13 exhibits decreased cracking.

However, formation of the $Al_xGa_{1-x}N$ buffer layer 13 fails to effectively alleviate tensile stress due to thermal expansion coefficient differences between the Si substrate 11 and GaN layer 15, thus causing production of a crack network on the surface of the grown GaN layer 15. Such a crack network not only degrades the performance of optical devices such as LEDs prepared on the basis of the GaN layer 15 but also drastically reduces the service life of the devices.

Another method to solve problems associated with cracks occurring upon formation of the GaN layer on the Si substrate is to form a GaN layer on a ZnO buffer layer formed on a silicon substrate. However, this method also fails to solve fundamental problems such as cracking. Therefore, there remains a need for a method capable of forming a good quality GaN layer on the Si substrate by solving cracking problem due to differences in lattice constant and thermal expansion coefficient between the Si substrate and GaN layer.

SUMMARY OF THE INVENTION

Therefore, the present invention has been made in view of the above problems, and it is an object of the present invention to provide, a nitride based semiconductor device including a high quality GaN layer having a substantially crack-free and even surface on a silicon substrate.

It is another object of the present invention to provide a process for preparing a nitride based semiconductor device which is capable of effectively inhibiting crack generation when forming the GaN layer on the silicon substrate.

In accordance with the present invention, the above and other objects can be accomplished by the provision of a nitride based semiconductor device comprising a plurality of nanorods aligned and formed on the silicon in the vertical direction; an amorphous matrix layer filling spaces between nanorods to protrude some upper portion of nanorods; and a GaN layer formed on the matrix layer.

In accordance with one embodiment of the present invention, the nitride based semiconductor device may further comprise a ZnO buffer layer formed between the silicon substrate and nanorods.

The nanorods may be formed of ZnO, GaN, AlN, AlGaN or AlGaInN. Preferably, the space between individual nanorods is within the range of about 100 to 200 nm. The diameter of the nanorods is preferably within the range of about 10 to 20 nm. In addition, the length of individual nanorods is preferably between about 50 and 900 nm. Further, the height of some upper portion of nanorods protruded from the amorphous matrix layer preferably ranges from about 20 to 100 nm.

The amorphous matrix layer is preferably made up of silicon oxides or silicon nitrides. Use of the nitride based semiconductor device including a composite layer of a nanorod-amorphous matrix layer makes it possible to manufacture semiconductor optical devices such as LEDs having a crack-free high-quality GaN layer.

In accordance with another aspect of the present invention, there is provided a process for preparing a nitride based semiconductor device, comprising the steps of: forming a plurality of nanorods aligned in the vertical direction on a silicon substrate; forming an amorphous matrix layer filling spaces. between the nanorods so as to protrude some upper portion of the nano rods from the upper surface of the amorphous matrix layer; and growing a GaN layer on the matrix layer using some upper portion of the nanorods as a seed.

In accordance with one embodiment of the present invention, the above-mentioned process may further comprise forming a ZnO buffer layer on the silicon substrate prior to forming a plurality of nanorods. Further, the process may further comprise a step of separating the silicon substrate, nanorods and matrix layer from the GaN layer. Therefore, a thin film including the GaN layer may be obtained. In this case, the separation step may be easily performed by wet etching. By removing the silicon substrate from the GaN layer via the separation step as mentioned above, the problem can be obviated in which the silicon substrate absorbs light. In other words, when *employing the GaN layer formed in accordance with the present invention in the LED, the silicon substrate can be easily removed such that light generated from an active layer is not absorbed by the silicon substrate.

Preferably, the step of forming nanorods is performed using a Metal Organic Chemical Vapor Deposition (MOCVD) method. Upon formation of ZnO nanorods using the MOCVD method, diethylzinc (DEZn) may be used as a Zn source for forming the ZnO nanorods, and oxygen gas may be used as an oxygen source. In addition, the I process temperature in forming the ZnO nanorods is preferably a temperature of 400 to 500° C. Preferably, the step of growing the GaN layer is performed at a temperature of more than 1100° C. and a pressure of about 10 to 300 Torr, for lateral growth of the GaN layer.

In accordance with the present invention, intercalating a plurality of nanorods aligned in the vertical direction on the Si substrate and an amorphous matrix layer between a lower Si substrate and upper GaN layer may effectively alleviate thermal stress due to differences in the thermal expansion coefficient between the Si substrate and GaN layer. That is, even when the GaN layer is grown at a high temperature using partially protruded nanorods over the matrix layer as the seed, the GaN layer is minimally affected by thermal stress due to due to differences in the thermal expansion coefficient between the Si substrate and GaN layer, upon cooling the GaN layer. This is because the nanorods and amorphous matrix layer serve as a sponge to absorb stress between the Si substrate and GaN layer. Therefore, there is substantially no cracking on the upper GaN layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
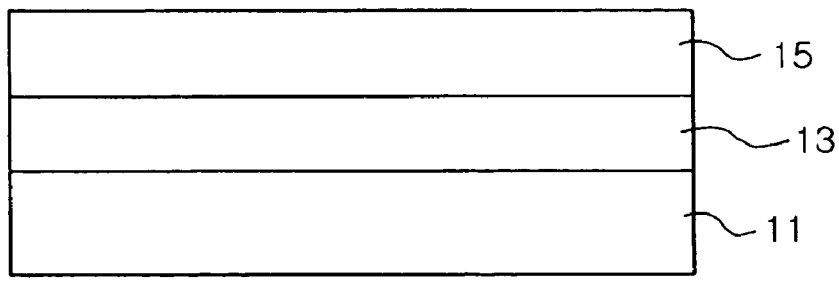
FIG. 1 is a cross-sectional view of a conventional nitride based semiconductor device.

The present invention now will be, described more fully with reference to the accompanying drawings, in which embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to those skilled in the art. Therefore, in the drawings, shape and size of some elements may be exaggerated for clarity, and like numbers refer to like elements throughout.

Figure 2:
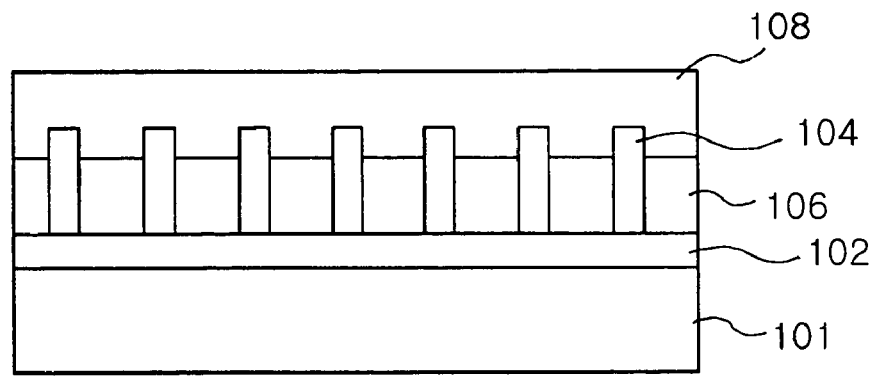
FIG. 2 is a cross-sectional view of a nitride based semiconductor device in accordance with one embodiment of the present invention.

FIG. 2 is a view schematically showing a cross-sectional structure of a nitride based semiconductor device in accordance with one embodiment of the present invention. Referring to FIG. 2, a ZnO buffer layer 102, obtained by low-temperature growth, was formed on a Si. substrate 101. A plurality of nanorods 104 made of ZnO was aligned on the ZnO buffer layer 102 in the vertical direction, relative to the surface of the Si substrate.

The nanorods 104 are preferably formed so as to have a uniform distribution on the ZnO buffer layer 102 and the spacing between individual nanorods 104 is preferably within the range of about 100 to 200 nm. The diameter of the nanorods 104 is preferably within the range of about 10 to 20 nm and the length thereof is preferably within the range of about 50 to 900 nm.

Spaces between ZnO nanorods 104 were filled with an amorphous matrix layer 106 of $SiO_2$ or SiN. At this time, the amorphous matrix layer 106 fills spaces between ZnO nanorods 104, and is thinner than the average length of the ZnO nanorods 104, such that some upper portion of the ZnO nanorods 104 is protruded from the upper surface of the amorphous matrix layer 106. In such a manner, the upper part of the partially protruded ZnO nanorods 104 is used as a seed for GaN layer growth.

A GaN layer 108 was formed over the nanorods 104 and amorphous matrix layer 106. This GaN layer 108 may be utilized in Group III nitride based LEDs and the like. For example, a GaN based LED may be configured by sequentially laminating an n-type clad layer, active layer and p-type clad layer, made up of GaN and/or AlGaN, on the GaN layer 108.

In the nitride based semiconductor device having the above-mentioned configuration, the GaN layer 108 has very few cracks. This is due to the fact that the nanorods 104 and amorphous matrix layer 106 serve to effectively block thermal stress resulting from the differences in thermal expansion coefficient between the GaN layer 108 and Si substrate 101.

The contact area between the nanorods 104 and GaN layer 108 is very small as compared with the total area of the GaN layer 108. Therefore, stress transfer between the Si substrate 101 and GaN layer 108 via nanorods is greatly reduced. Further, the amorphous matrix layer 106 does not undergo chemical binding or reaction with the GaN layer 108 disposed over the matrix layer 106. Thus, the nanorod-matrix composite layer alleviates thermal stress due to cooling, functioning as a stress-absorbing sponge. Consequently, despite the approximate 55% difference in the thermal expansion coefficient between GaN and Si, the nanorod-amorphous matrix composite layer 104 and 106 effectively blocks thermal stress generated due to the thermal expansion coefficient differences between GaN and Si.

Therefore, very few cracks were observed on the surface of the GaN layer 108, which was formed on the nanorod-amorphous matrix composite layers 104 and 106. Consequently, the GaN layer 108 has a high quality single crystal inner structure, imparting the GaN based semiconductor optical device with excellent performance.

Figure 3:
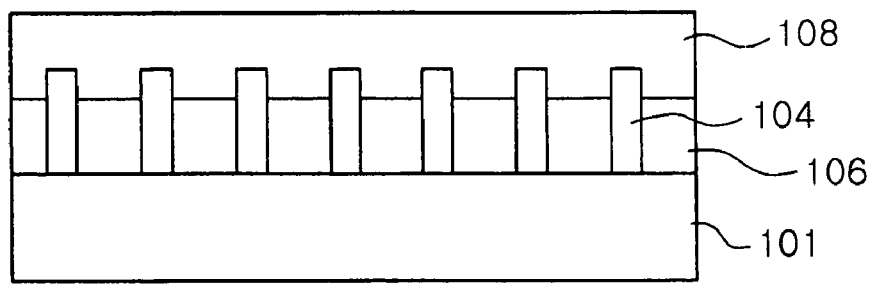
FIG. 3 is a cross-sectional view of a nitride based semiconductor device in accordance with another embodiment of the present invention.

FIG. 3 shows a cross-sectional structure of a nitride based semiconductor device in accordance with another embodiment of the present invention. In this embodiment, a ZnO buffer layer was not formed on a Si substrate 101 and ZnO nanorods 104 were directly formed on the Si substrate 101. The ZnO nanorods 104 can be grown on the Si substrate 101 without formation of the ZnO buffer layer using MOCVD. The remaining layers, i.e., an amorphous matrix layer 106 and GaN layer 108 are formed using the same method as the embodiment described with reference to FIG. 2. As such, with elimination of the ZnO buffer, nanorod growth may require greater period of time and a advantage of reducing the number of process is obtained.

Now, a process for preparing a nitride based semiconductor device in accordance with one embodiment of the present invention will be described with reference to FIGS. 4 through 7.

Figure 4:
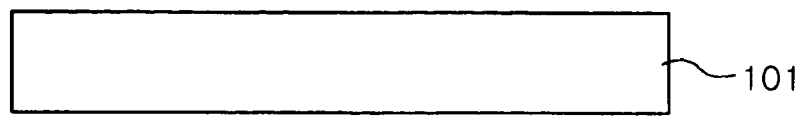
FIGS. 4 through 7 are, respectively, cross-sectional views and perspective views illustrating a process for preparing a nitride based semiconductor device in accordance with one embodiment of the present invention.
Figure 5:
Figure 5:
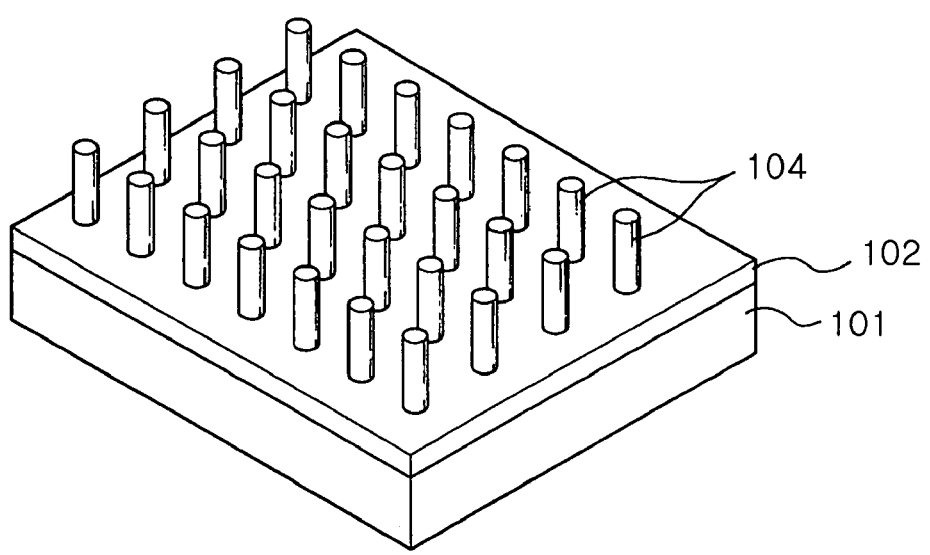
Figure 6:
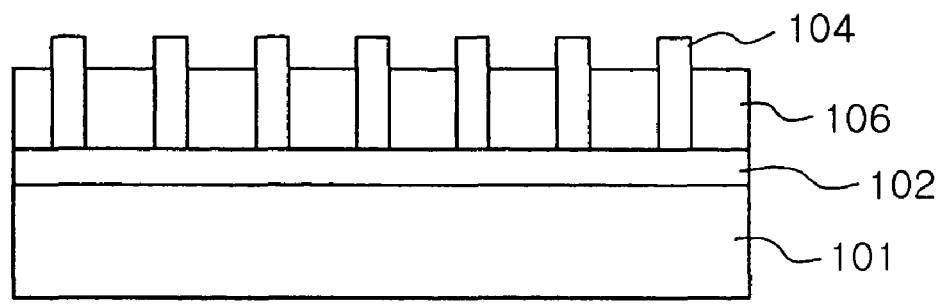
Figure 6:
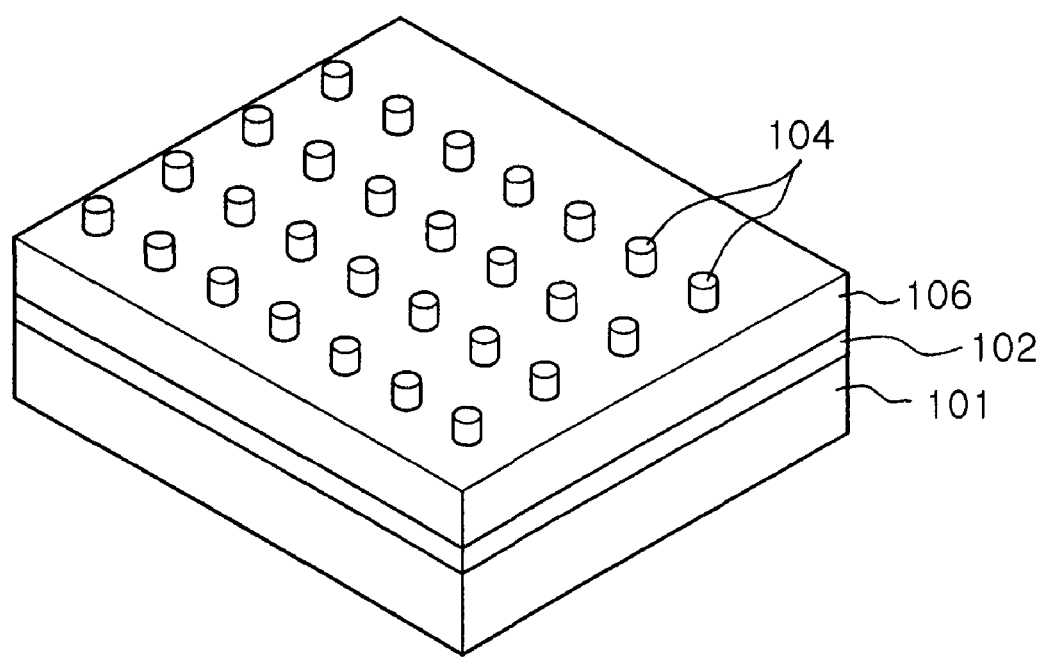
Figure 7:
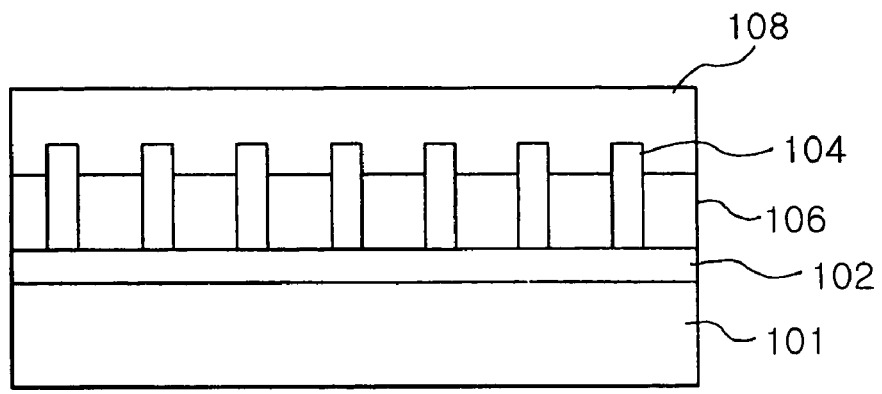
Figure 7:
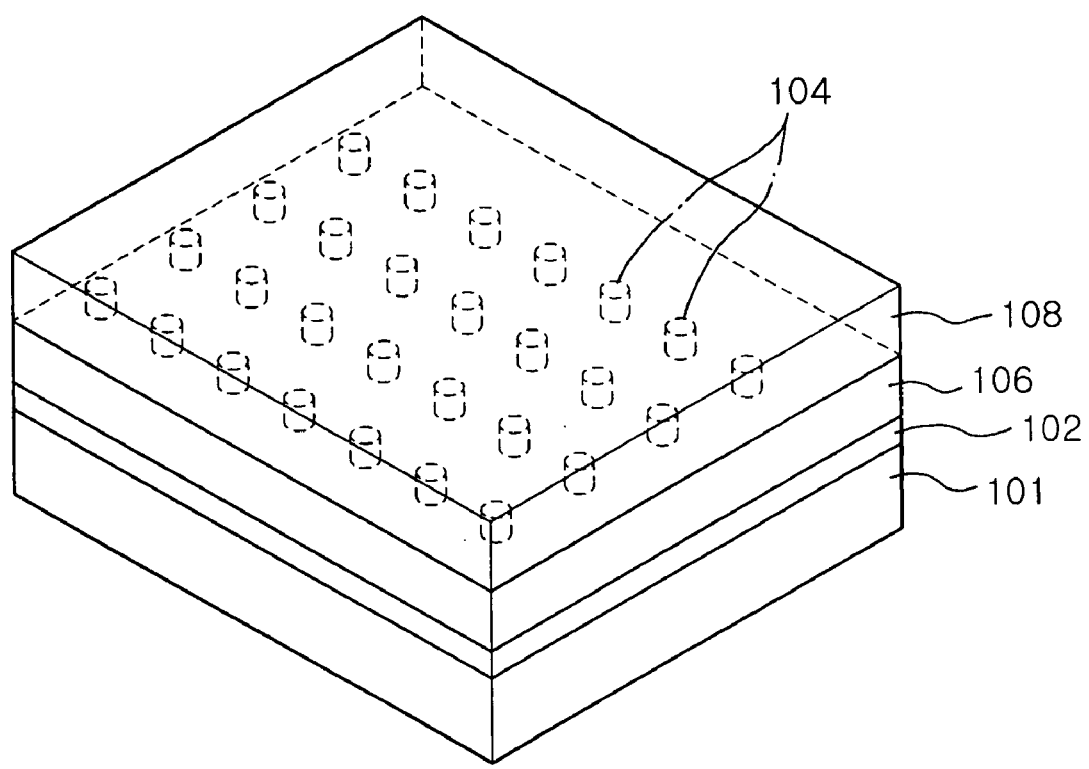

Referring to FIG. 4, first, a Si substrate 101 made of silicon single crystals is provided in a reaction chamber. Next, as shown in FIGS. 5a and 5b, a ZnO thin film was grown at a low temperature on the substrate 101 to form a ZnO buffer layer 102 and then ZnO nanorods 104 were grown on the upper surface of the Si substrate 101 in the vertical (longitudinal) direction by MOCVD. Alternatively, the ZnO nanorods 104 may be directly grown on the Si substrate 101 without formation of the ZnO buffer layer 102.

The ZnO nanorods 104 may be grown using MOCVD described below. That is, as, a source gas, oxygen and diethylzinc (DEZn) at a flow rate of about 20:1 to 40:1 were supplied to a reaction chamber containing the substrate 101 to perform MOCVD. At this time, the temperature for growth of Zn nanorods 104 is preferably maintained at a temperature of 400 to 500° C. Therefore, the ZnO nanorods 104, which were arranged vertically to the Si substrate 101, were formed with very uniform density and height on the ZnO buffer layer 102. At this time, the time period for ZnO nanorod growth was controlled such that the diameter and height (length) of the ZnO nanorods were between about 10 to 20 nm and between about 50 and 900 nm, respectively. A spacing of about 100 to 200 nm was maintained between individual nanorods 104.

Next, as shown in FIGS. 6a and 6b, an amorphous matrix layer 106 made up of SiN (or SiO$_2$) was formed so as to fill the spaces between the nanorods 104. In this connection, the matrix layer 106 was formed so as to be thinner than the average height of the ZnO nanorods 104. That is, by forming the matrix layer 106 such that it is thinner than the average height of the nanorods 104, portions of the upper sections of the nanorods 104 protrude from the upper surface of the matrix layer 106. The protruded portions of the nanorods 104 serve as a seed for subsequent growth of the GaN layer. The protruded upper part of the nanorods 104 is preferably protruded about 20 to 100 nm from the upper surface of the matrix layer 106.

Next, as shown in FIGS. 7a and 7b, the upwardly protruded portions of the nanorods 104 were used as a seed around which a GaN layer 108 was grown. Since GaN is easily grown from ZnO seeds, but is not grown from, SiN or SiO$_2$, the GaN layer 108 exhibits selective epitaxial growth. Therefore, in order that the GaN may grow from the upper protruded part of the nanorod to completely cover a nanlorod-matrix composite layer 104 and 106, lateral growth is required. In order to grow the GaN layer 108 from ZnO seeds (upwardly protruded portions of the nanorods) in a lateral growth fashion, the GaN layer 108 is advantageously grown at a high temperature of more than 1100° C. and a low pressure of 10 to 300 Torr.

When the GaN layer 108 is formed on the nanorod-matrix composite layer through the above-mentioned process, GaN single crystals having very few defects such as cracks are obtained. This is because the nanorod-matrix composite layer serves to absorb thermal stress due to differences in thermal expansion coefficients between the lower Si substrate 101 and upper GaN layer 108. Therefore, even when cooling to room temperature after growth of the GaN layer 108, thermal stress is not transferred from the silicon substrate 101 to the GaN layer.

The thermal stress absorption phenomenon of the nanorod-matrix composite layer results from a contact area between the nanorods and the GaN layer, and a binding condition between the amorphous matrix layer 106 and GaN layer. That is, the contact area between the multiplicity of nanorods 104 and the GaN layer is relatively small as compared to the total area of the GaN layer. Thus, thermal stress transfer between the Si substrate 101 and GaN layer 108 via nanorods 104 is greatly reduced. Further, there is no chemical or crystallogical bond between the amorphous matrix layer 106 and GaN layer 108. Therefore, thermal stress due to differences in thermal expansion coefficient is not easily transferred through the amorphous matrix layer 106 to the GaN layer. Thus, since the nanorod-matrix composite layer blocks thermal stress, the GaN layer 108 formed thereon substantially exhibits no defects such as cracks.

In structures in accordance with the present invention as shown in FIGS. 7a and 7b, the amorphous matrix layer 106 and ZnO nanorods 104 disposed below the GaN layer 108 exhibit the unique characteristic that they are selectively etched by specific solvents. Therefore, the GaN layer 108 can be easily separated from the nanorod-amorphous matrix composite layers 104 and 106 and the Si substrate by way of wet etching. As such, the fact that the Si substrate can be easily separated from the GaN layer 108 is, in particular, of extreme utility in that the problem wherein the Si substrate absorbs light can be eliminated. For example, a thin film GaN LED having no Si substrate can be prepared by sequentially forming an n-type clad layer, an active layer and a p-type clad layer on the GaN layer 108, wet etching the nanorods 104 and amorphous matrix layer 106 to separate the GaN layer 108 from the Si substrate 101, and then forming a reflective layer on the p-type clad layer.

If the preparation process in accordance with the present invention is used to prepare semiconductor optical devices such as LEDs, improved performance of the devices and increased service life thereof are obtained due to use of a crack-free high-quality GaN layer. For example, a nitride based semiconductor light emitting device, as shown in FIG.

Figure 8:
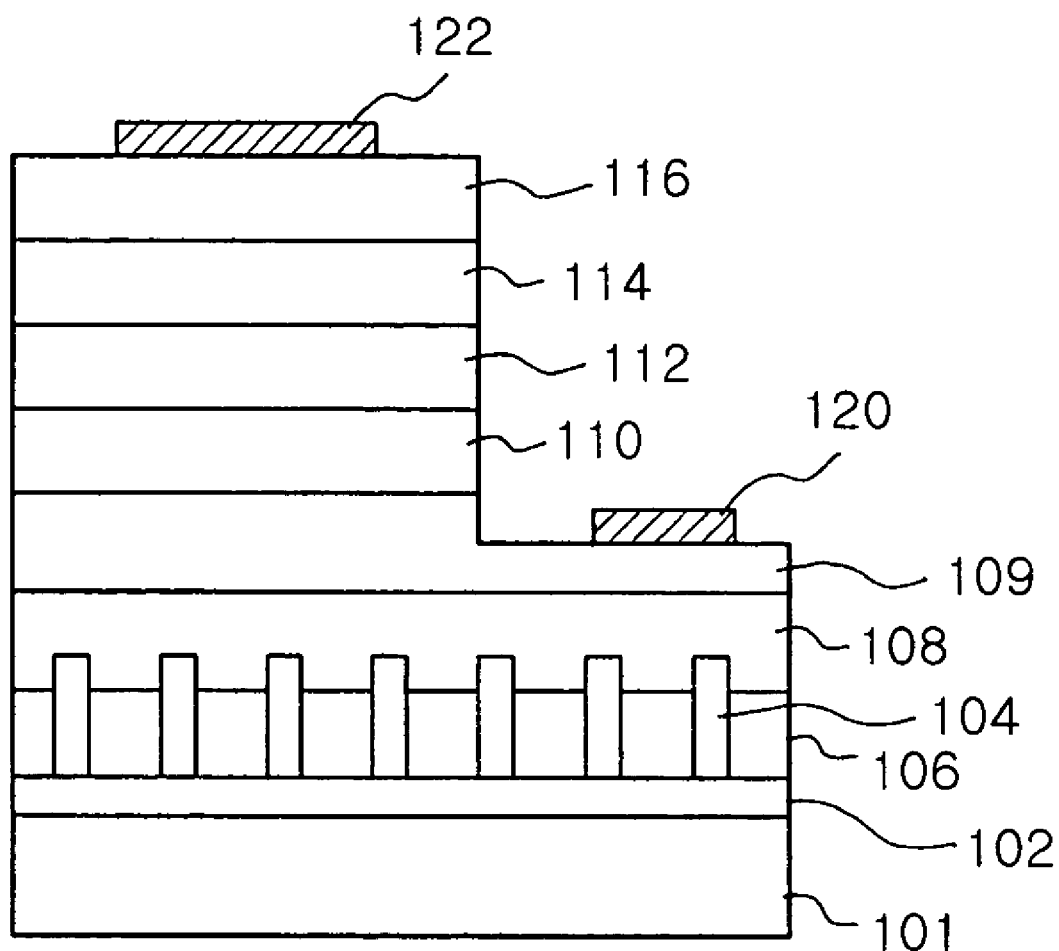
FIG. 8 is a cross-sectional view of a nitride based semiconductor light emitting device prepared using a process for preparing a nitride based semiconductor device in accordance with one embodiment of the present invention.

8, may exhibit excellent performance and life span as compared to LED devices using conventional AlN buffer layers or Al$_x$Ga$_{1-x}$N transition layers. Referring to FIG. 8, an n-type GaN layer 109, an n-type AlGaN layer 110, an InGaN active layer 112, a p-type AlGaN layer 114, and a p-type GaN layer 116 were laminated to form a mesa structure upon the structure of the present invention made up of a ZnO buffer layer 102, a ZnO nanorod-amorphous matrix composite layer (104 and 106) and a GaN layer 108, on the silicon substrate 101. A p-electrode structure 122 was formed on the p-type GaN layer 116, and an n-electrode structure 109 was formed on the exposed n-type GaN layer 109. As such, if the nanorod-matrix composite layer (104 and 106) in accordance with the present invention is used to configure semiconductor light emitting devices, improved performance of the devices and increased service life thereof are obtained by way of the high-quality GaN layer.

Although ZnO was used as a nanorod material in the above-mentioned embodiments, other materials may also be used. For example, a GaN nanorod, an AlGaN nanorod or an AlGaInN nanorod may be utilized. In particular, when a Group III nitride based nanorod is employed, it is preferred to form a ZnO buffer layer prior to conducting the process of nanorod growth.

As apparent from the above description, in accordance with the present invention, a crack-free high-quality GaN layer is provided by growing a GaN layer using a nanorod-matrix composite layer formed on a Si substrate. Therefore, if such a GaN layer is used to prepare semiconductor optical devices, improved performance of the devices and increased service life thereof can be obtained. In addition, since the nanorod-matrix composite layer can be easily removed by wet etching, a thin film GaN LED having no Si substrate can be easily prepared.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride based semiconductor device, comprising:
   a plurality of nanorods aligned and formed on a silicon substrate in the vertical direction;
   an amorphous matrix layer filling spaces between nanorods so as to protrude some upper portion of the nanorods protrude therefrom;
   a GaN layer formed on the matrix layer;
   an n-type GaN layer formed on the GaN layer;
   an active layer formed on the n-type GaN layer; and
   a p-type GaN layer formed on the active layer,
   wherein the nanrods are made of ZnO, GaN, AlN, AlGaN or AlGaInN.

2. The nitride based semiconductor device as set forth in claim 1, further comprising a ZnO buffer layer formed between the silicon substrate and nanorods.

3. The nitride based semiconductor device as set forth in claim 1, wherein the space between nanorods is within the range of about 100 to 200 nm.

4. The nitride based semiconductor device as set forth in claim 1, wherein the diameter of the nanorods is within the range of about 10 to 20 nm.

5. The nitride based semiconductor device as set forth in claim 1, wherein the length of individual nanorods is between about 50 and 900 nm.

6. The nitride based semiconductor device as set forth in claim 1, wherein, the height of some upper portion of nanorods protruded from the amorphous matrix layer ranges from about 20 to 100 nm.

7. The nitride based semiconductor device as set forth in claim 1, wherein the amorphous matrix layer is made up of silicon oxides or silicon nitrides.

* * * * *